United States Patent
Menut et al.

(10) Patent No.: US 7,488,653 B2
(45) Date of Patent: Feb. 10, 2009

(54) SEMICONDUCTOR DEVICE AND METHOD FOR IMPLANTATION OF DOPING AGENTS IN A CHANNEL

(75) Inventors: Olivier Menut, Saint Martin d'Heres (FR); Nicolas Planes, Le Versoud (FR); Sylvie Del Medico, Saint Hilalre (FR)

(73) Assignee: STMicroelectronics Crolles 2 (SAS), Crolles (FR)

( * ) Notice: Subject to any disclaimer, the term of this patent is extended or adjusted under 35 U.S.C. 154(b) by 44 days.

(21) Appl. No.: 11/687,413

(22) Filed: Mar. 16, 2007

(65) Prior Publication Data

US 2008/0012052 A1    Jan. 17, 2008

(30) Foreign Application Priority Data

Mar. 17, 2006    (FR) ................... 06 02376

(51) Int. Cl.
*H01L 21/8234* (2006.01)
(52) U.S. Cl. .............. 438/276; 438/278; 438/289; 438/290; 438/526; 438/531; 257/E21.618; 257/E21.443
(58) Field of Classification Search .......... 438/217, 438/276, 278, 289, 290, 526, 531, FOR. 191; 257/345, E21.618, E21.443
See application file for complete search history.

(56) References Cited

U.S. PATENT DOCUMENTS

| | | | | |
|---|---|---|---|---|
| 3,886,003 A | * | 5/1975 | Takagi et al. ............... 438/275 |
| 4,315,781 A | * | 2/1982 | Henderson .................. 438/276 |
| 5,516,711 A | * | 5/1996 | Wang .......................... 438/217 |
| 5,536,962 A | * | 7/1996 | Pfiester ....................... 257/392 |
| 5,591,652 A | * | 1/1997 | Matsushita ................. 438/259 |
| 5,789,778 A | * | 8/1998 | Murai ......................... 257/325 |
| 6,051,482 A | * | 4/2000 | Yang .......................... 438/526 |
| 6,100,568 A | * | 8/2000 | Lage .......................... 257/392 |
| 6,207,999 B1 | * | 3/2001 | Wu ............................. 257/390 |
| 6,255,174 B1 | * | 7/2001 | Yu .............................. 438/286 |
| 6,329,235 B1 | | 12/2001 | Kuo ........................... 438/238 |
| 6,329,250 B1 | * | 12/2001 | Sakui ......................... 438/275 |
| 6,621,125 B1 | * | 9/2003 | Wang .......................... 257/355 |
| 7,176,530 B1 | * | 2/2007 | Bulucea et al. ............. 257/369 |
| 2003/0073269 A1 | | 4/2003 | Tran ........................... 438/183 |
| 2003/0080390 A1 | * | 5/2003 | Tseng ......................... 257/412 |
| 2004/0219724 A1 | | 11/2004 | Park et al. ................... 438/197 |
| 2004/0248358 A1 | * | 12/2004 | Komori ...................... 438/238 |
| 2005/0227440 A1 | * | 10/2005 | Ema et al. ................... 438/275 |
| 2008/0001203 A1 | * | 1/2008 | Ishihara ...................... 257/314 |
| 2008/0012052 A1 | * | 1/2008 | Menut et al. ............... 257/288 |

* cited by examiner

*Primary Examiner*—George Fourson
(74) *Attorney, Agent, or Firm*—Lisa K. Jorgenson; Allen, Dyer, Doppelt, Milbrath & Gilchrist, P.A.

(57) ABSTRACT

A semiconductor device includes a substrate of a first type of conductivity provided with at least one gate on one of its faces, and at least two doped regions of a second type of conductivity for forming a drain region and a source region. The two doped regions are arranged in the substrate flush with the face of the substrate on each side of a region of the substrate located under the gate for forming a channel between the drain and source regions. At least one region of doping agents of the second type of conductivity is implanted only in the channel.

14 Claims, 1 Drawing Sheet

SEMICONDUCTOR DEVICE AND METHOD FOR IMPLANTATION OF DOPING AGENTS IN A CHANNEL

CROSS REFERENCE TO RELATED APPLICATION

This application claims the priority benefit of French patent application number 0602376 filed on Mar. 17, 2006, titled "Semiconductor Device And Method For Implantation Of Doping Agents In A Channel", which is hereby incorporated by reference in its entirety.

FIELD OF THE INVENTION

The invention relates to a semiconductor device and a method for implanting doping agents in a channel. The method may be particularly suitable for implanting doping agents or dopants in a channel region of a device made using Metal-Oxide Semiconductor (MOS) technology, such as a memory including an SRAM (Static Random Access Memory) type memory or a DRAM (Dynamic Random Access Memory) type memory, for example.

BACKGROUND OF THE INVENTION

Progress made in technology for reducing the size of semiconductor devices introduces new constraints. For devices made using MOS technology, such as MOSFETS (Metal-Oxide Semiconductor Field-Effect Transistors), the reduction in the gate widths causes a reduction in the threshold voltage. It is sometimes necessary to have a high threshold voltage, for example in MOS transistors used in an SRAM or DRAM. This is usually done by increasing the channel doping levels in order to increase threshold voltages of these transistors. But one consequence is, for example, to increase leakage currents at drain-substrate and source-substrate junctions (referred to herein as drain (source)—substrate junctions). This increase in leakage currents may be critical for these devices, particularly for memories such as an SRAM and DRAM.

It is also known that supplementary implants of doping agents can be made in the substrate to increase the threshold voltages of these transistors, in addition to channel doping done during manufacture of a MOS type transistor, for example. One known method for implantation of doping agents in a device 1 made using MOS technology is shown in FIG. 1.

In FIG. 1, the device 1 is an NMOS transistor 13. The device 1 includes a substrate 8 and a gate 2 arranged on a face 12 of the substrate S. The N+ doped regions 3 and 4 arranged on each side of a channel 15 of the NMOS transistor 13 form doped source and drain regions of the NMOS transistor 13. Before the gate 2 is made, the substrate 8 is subjected to a vertical ionic implantation of phosphorus, forming a first N doped region 9 throughout the substrate 8. Production of this first region 9 is a first step in the doping agent implantation method.

After the gate 2 has been formed on the substrate 8, a second ionic implantation of N doping agents is made at the first region 9, forming a second N doped region 10 called a pocket. This is done by making the ionic implantation using ion beams 11 inclined at an angle of about 25° from normal to the plane defined by the face 12 of the substrate B.

The pocket 10 thus created is distributed in the channel 15, but also in the drain region 4 at a depth of about 10 to 15 nanometers below the surface 12, for example. This operation may be repeated four times by rotating by 90° each time normal to the plane defined by the face 12 of the substrate 8. Each time a new pocket 10 is created in the channel 15 and the source region 3 and the drain region 4. In FIG. 1, only one pocket 10 is shown corresponding to the first ionic implantation. The device 1 is then annealed, causing the diffusion of doping agents located in the pockets 10 throughout the channel 15 of the NMOS transistor 13 of the device 1.

But the device 1 for which the channel 15 includes doping agents implanted using this method has high leakage currents, for example, about 30 to 40 pA. This is particularly at the drain (source)—substrate junction, and is due to the distribution of doping agents throughout the channel 15, and also in the source and drain regions 3, 4.

SUMMARY OF THE INVENTION

An object of the invention is to provide a semiconductor device in which doping agents are implanted using a method wherein drain (source)—substrate leakage currents are lower than prior art devices while maintaining a threshold voltage at least identical to the threshold voltage of the prior art devices.

To achieve this object, the semiconductor device includes a substrate of a first type of conductivity provided with at least one gate on one of its faces, and at least two doped regions of a second type of conductivity forming drain and source regions arranged in the substrate flush with the face of the substrate. The at least two doped regions may be on each side of a substrate region located under the gate for forming a channel between the drain and source regions. At least one region of doping agents of a second type of conductivity may be implanted only in the channel.

Thus, by making an implantation of doping agents only in the channel and not a first region of doping agents throughout the substrate, a more precise implantation of doping agents is made. This leads to a reduction of leakage currents at the drain (source)—substrate junctions.

Considering that doping agents are located more precisely, in other words only in the channel, the threshold voltage may remain approximately the same as the threshold voltage for the devices according to prior art, as in the case of a MOS transistor, for example. The device could be a MOS type device, a transistor or a memory such as an SRAM or a DRAM, for example.

Another aspect of the invention is directed to a method for implanting doping agents in a semiconductor device as described above, including at least one ionic implantation step in the channel, thus forming at least one region of doping agents of the second type of conductivity implanted only in the channel.

The ionic implantation step may be performed using at least one inclined ion beam, for example inclined from normal to the plane defined by the face of the substrate, by an angle equal to at least 40 degrees, or 45 degrees, or 50 degrees, or 55 degrees or a value higher than 55 degrees, or between 40 degrees or 45 degrees, and 50 degrees or 55 degrees or a value greater than 55 degrees.

The method for implanting doping agents in a semiconductor device may include a substrate of a first type of conductivity on which a plurality of devices is formed, each including at least one gate arranged on a face of the substrate. At least two doped regions of a second type of conductivity may be on the substrate, thus forming drain and source regions arranged in the substrate so as to be flush with the face of the substrate. The at least two doped regions may be on each side of a region of the substrate located under the gate, and form a channel between the drain and source regions. The method may include an ionic implantation step in at least one channel through at least one ion beam inclined from normal to the plane as defined by the face of the substrate by at least an angle for which the tangent is equal to the ratio between the height of a gate and the distance separating two adjacent gates.

With this doping agent implantation method, leakage currents at drain (source)—substrate junctions of the devices thus doped are reduced, while maintaining a high threshold voltage. This new method can also eliminate the implantation step of the first region of doping agents made using methods according to prior art.

The angle of inclination of the ion beam may be equal to at least 40 degrees, or 45 degrees, or 50 degrees, or 55 degrees, or a value greater than 55 degrees, or between 40 degrees or 45 degrees, and 50 degrees or 55 degrees or a value greater than 55 degrees.

Each of the devices formed on the substrate may be of the MOS type, or it may be a transistor. The semiconductor device may be a memory, such as an SRAM or DRAM.

BRIEF DESCRIPTION OF THE DRAWINGS

The invention will be better understood after reading the description of example embodiments given purely for information, and are in no way limiting with reference to the appended drawings in which.

DETAILED DESCRIPTION OF THE PREFERRED EMBODIMENTS

Identical, similar or equivalent parts of the different figures described below are marked with the same numeric references so as to facilitate cross-references between one figure and another. The different parts shown in the figures are not necessarily all shown at the same scale to make the figures more easily legible.

Figure 1:
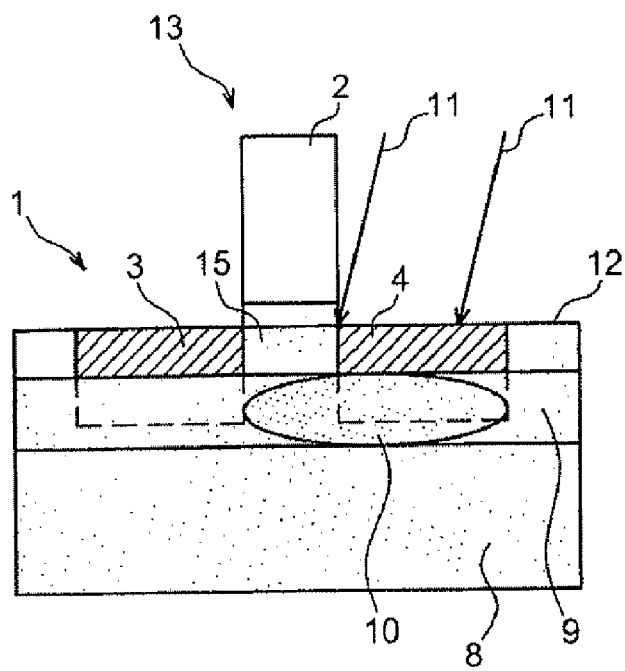
FIG. 1 shows a semiconductor device for which the channel doping is performed using a method according to prior art.
Figure 2:
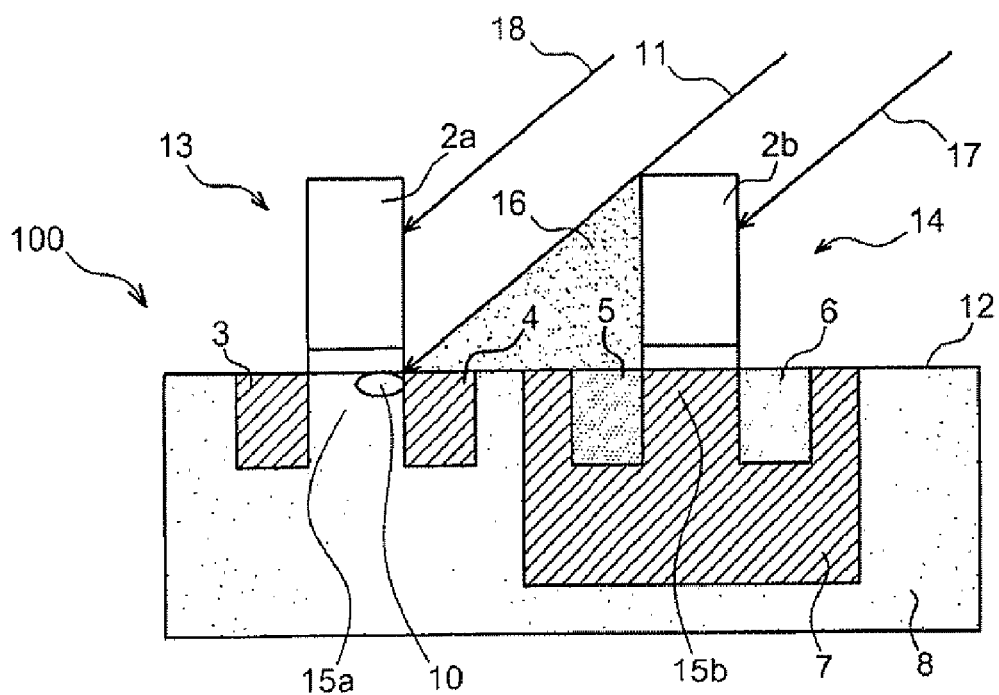
FIG. 2 shows a semiconductor device for which the channel doping is performed using a method according to the invention.

FIG. 2 illustrates a semiconductor device 100 according to the invention, for which doping agents are implanted in a channel using a method also according to the invention. The device 100 is made in bulk technology in this example embodiment, but it could also be made in SOI (Silicon On Insulator) technology. Only elements different from those shown in FIG. 1 will be described in the following.

The device 100 in FIG. 2 is a CMOS device with an NMOS transistor 13 and a PMOS transistor 14. Only an implantation of doping agents in a channel 15a of the NMOS transistor 13 will be described. Unlike the device 1 according to the prior art, the device 100 does not include a first N doped region 9. Only a region 10 called a pocket with doping agents of the second type of conductivity is implanted in the channel 15a.

In this example embodiment, the transistor 13 is an NMOS transistor, and the doping agents of the pocket 10 are of the N type. In this example embodiment, this pocket 10 is made flush with the face 12 of the substrate 8, under the gate 2a. In FIG. 1, the pocket 10 is implanted adjacent to the drain region 4 because the ionic implantation is made at the interface between the channel 15a and the drain region 4.

Compared with device 1, the pocket 10 is located only in the channel region 15a and not in the drain region 4. Thus, despite the absence of the first region 9 of doping agents, the doping level of the channel 15a of the device 100 according to the invention is substantially the same as the doping level of the device 1 according to prior art. This level may be, for example, about $10^{18}$ atoms per $cm^3$. The drain (source)—substrate leakage currents are reduced and the threshold voltage remains high due to the better position of doping agents in the channel 15a. For example, for a device according to prior art operating with a cell current of 19 μA, the leakage currents measured are about 30 pA. With a 19 μA cell current, the leakage currents measured on an SRAM made according to the invention are about 6 pA.

The implantation of the pocket 10 is made using an ion beam 11. The doping agents used are the same as those already known in prior art (for example, phosphorus for N doping agents and boron for P doping agents). The particular inclination of this beam 11 enables implantation of the pocket 10 only in the channel 15a. In FIG. 2, the beam 11 is inclined from normal to the plane defined by the face 12 of the substrate 8 by an angle of about 45°. This angle could be greater than 45° depending on the configuration of the device in which the channel was doped.

The device 100 could also simply be a MOS device such as a transistor, for example a MOSFET. In particular, the doping method may be used during manufacturing of a device such as an SRAM or DRAM, including a plurality of components including transistors made using the CMOS technology. During manufacturing of CMOS transistors, the first step is channel doping done by a vertical ionic implantation in the substrate.

The next step is that the gates are made by photolithography and are then etched. LDD (Lightly Doped Drain) implantations are then made to form source and drain regions. The next step is implantation of doping agents in the channels. Pockets can be implanted simultaneously in channels in all MOS transistors in the SRAM by a plurality of ion beams.

Transistors 13 and 14 in FIG. 2 may represent two of these transistors, the wafer on which the SRAM 100 is made being represented by the substrate 8. Three ion beams 11, 17 and 18 are shown in FIG. 2. In order to implant the pockets 10 only in the channel 15a and not in the source or drain regions 3, 4, the ion beams 11, 17 and 18 are inclined from normal to the plane defined by the face 12 of the substrate 8 by an angle, the tangent of which is equal to the ratio between the height of the gate 2b and the distance separating the gates 2a and 2b.

Thus, over the entire SRAM 100, the gates close to a transistor prevent ion beams from doping the source and drain regions of the transistor for which the channel is doped. The ion beams can then only dope the gates or the channel of the transistor. In other words, gates close to the transistor form a shadow zone for the channel to be doped in the transistor.

In FIG. 2, only the beam 11 is used to implant the pocket 10, and the other two beams 17 and 18 cannot make an implantation in the substrate 8 due to the gates 2a and 2b. Thus, a self-alignment of the pocket 10 is made in the channel 15a with respect to the gates 2a and 2b.

In FIG. 2, the gate 2b forms a shadow zone 16 in the space between the two gates 2a and 2b, preventing the beam 17 from doping the substrate region 8 located between the two gates 2a and 2b. Given that the distances between the gates and the gate heights for an SRAM memory are uniform from one transistor to the next, the channel may be doped on all transistors for which the same doping has to be done simultaneously, for example all NMOS transistors in the wafer.

The doping of the channel 15a may be made in two or four steps by making several ionic implantations, each time rotating by 90° or 180° from normal to the plane defined by the surface 12 of the substrate 8 so as to make doping of the channel uniform. Thus, the result is a channel 15*a* including two or four doping agent pockets 10.

The device 100 is then annealed to diffuse doping agents implanted throughout the channel 15*a*. Gates at a spacing from each other can be made differently on the same device. Thus, when performing the method according to the invention, different implantations can be obtained leading to different threshold voltages proportional to the spacings between the gates. This method may be applicable for all technologies, including technologies still under study (for example, in 45 nm).

That which is claimed:

1. A method for dopant implantation in a semiconductor device comprising a substrate having a first conductivity type, at least one gate, at least one pair of drain and source regions of a second conductivity type in the substrate with a channel region therebetween and located under the at least one gate, the method comprising:
performing ionic implantation into the channel to form at least one region of dopants of the second conductivity type implanted only in the channel.

2. A method according to claim 1, wherein the at least one pair of drain and source regions are flush with a face of the substrate.

3. A method according to claim 1, wherein performing ionic implantation comprises using at least one ion beam inclined from normal to a plane defined by a face of the substrate by an angle equal to at least 45 degrees.

4. A method according to claim 1, wherein the semiconductor device comprises at least one MOS device.

5. A method according to claim 4, wherein the at least one MOS device comprises at least one transistor.

6. A method according to claim 1, wherein the semiconductor device comprises a static random access memory (SRAM).

7. A method according to claim 1, wherein the semiconductor device comprises a dynamic random access memory (DRAM).

8. A method for dopant implantation in a semiconductor device comprising a substrate having a first conductivity type, at least one gate, at least one pair of drain and source regions of a second conductivity type in the substrate with a channel region therebetween and located under the at least one gate, the method comprising:
performing an ionic implantation in the channel using at least one ion beam inclined from normal to a plane defined by a face of the substrate by at least an angle for which a tangent is equal to a ratio between a height of the at least one gate and a distance separating two adjacent gates.

9. A method according to claim 8, wherein the at least one pair of drain and source regions are flush with a face of the substrate.

10. A method according to claim 8, wherein the angle is equal to 45 degrees.

11. A method according to claim 8, wherein the semiconductor device comprises at least one MOS device.

12. A method according to claim 11, wherein the at least one MOS device comprises at least one transistor.

13. A method according to claim 8, wherein the semiconductor device comprises a static random access memory (SRAM).

14. A method according to claim 8, wherein the semiconductor device comprises a dynamic random access memory (DRAM).

* * * * *

UNITED STATES PATENT AND TRADEMARK OFFICE
CERTIFICATE OF CORRECTION

PATENT NO. : 7,488,653 B2  Page 1 of 1
APPLICATION NO. : 11/687413
DATED : February 10, 2009
INVENTOR(S) : Menut et al.

It is certified that error appears in the above-identified patent and that said Letters Patent is hereby corrected as shown below:

Cover Page, item 75   Delete: "Hilalre"
                     Insert: --Hilaire--

Column 1, Line 51    Delete: "substrate S"
                     Insert: --substrate 8--

Column 1, Line 64    Delete: "substrate B"
                     Insert: --substrate 8--

Signed and Sealed this

Ninth Day of June, 2009

JOHN DOLL
*Acting Director of the United States Patent and Trademark Office*